United States Patent
Shah et al.

(10) Patent No.: US 7,523,012 B2
(45) Date of Patent: Apr. 21, 2009

(54) METHOD AND SYSTEM FOR CONTROLLING A HANDHELD ELECTRONIC DEVICE

(75) Inventors: Dhaval N. Shah, Sunrise, FL (US);
Peter B. Gilmore, Plantation, FL (US);
Timothy M. Bergin, Tallevast, FL (US);
Manish W. Mahajan, Sunrise, FL (US)

(73) Assignee: Motorola, Inc., Schaumburg, IL (US)

( * ) Notice: Subject to any disclaimer, the term of this patent is extended or adjusted under 35 U.S.C. 154(b) by 51 days.

(21) Appl. No.: 11/772,948

(22) Filed: Jul. 3, 2007

(65) Prior Publication Data
US 2009/0009233 A1 Jan. 8, 2009

(51) Int. Cl.
*G01C 19/00* (2006.01)
(52) U.S. Cl. .................... 702/150; 379/455; 224/930
(58) Field of Classification Search .............. None
See application file for complete search history.

(56) References Cited

U.S. PATENT DOCUMENTS

| | | | |
|---|---|---|---|
| 2002/0103616 A1* | 8/2002 | Park et al. .................... 702/150 |
| 2003/0030342 A1* | 2/2003 | Chen et al. .............. 310/102 R |
| 2008/0012706 A1* | 1/2008 | Mak-Fan et al. ......... 340/568.1 |
| 2008/0191892 A1* | 8/2008 | Kirkup et al. ............ 340/686.6 |

* cited by examiner

*Primary Examiner*—Bryan Bui
*Assistant Examiner*—Jonathan Teixeira Moffat

(57) ABSTRACT

A method (500), a handheld electronic device (102) and an external accessory (402) for controlling at least one function of a plurality of functions of the handheld electronic device is provided. The method includes determining (504) whether the handheld electronic device is docked in an external accessory. Further, the method includes measuring (506) a first magnetic field density when the handheld electronic device is docked in the external accessory. Furthermore, the method includes generating (508) a signal to activate at least one function, based on an electrical parameter.

20 Claims, 5 Drawing Sheets

METHOD AND SYSTEM FOR CONTROLLING A HANDHELD ELECTRONIC DEVICE

FIELD OF THE INVENTION

The invention relates, in general, to the field of handheld electronic devices, and more specifically, to a method and system for controlling a handheld electronic device.

BACKGROUND OF THE INVENTION

Handheld electronic devices are becoming increasingly popular in the present world. Examples of such devices include cordless and mobile phones, Personal Digital Assistants (PDAs), Public Safety radios, pagers and other communication devices. With exponential technological advances, more and more operational features are being incorporated into these devices. For example, users of mobile phones have the option to change the ringtones, modify the ring volume of their phones, change the mode of operation of their phones from the silent to the vibration mode, etc. Typically, a user can change or modify these operational features by using the keys on the keypads of these handheld electronic devices. However, these keys are accessible to the users of the mobile phones only when the phones are not housed in an external accessory such as a holster. The holsters enable users to carry their mobile phones safely and conveniently. However, users may not be able to access the keypads of their phones while their phones are in their holsters.

As mentioned above, if the handheld electronic device is docked in an external accessory such as a holster or a clip, users have to manually take the device out of the accessory before changing any features on them. This may result in unwanted situations for users of the handheld electronic devices. For example, if a user is attending an important meeting and his/her mobile phone starts ringing loudly, he/she will have to first take the phone out of the holster before lowering the ring volume so that the meeting is not disrupted. In another scenario, a user listening to a song by using a handheld electronic device docked inside a holster has to take the electronic device out of the holster every time he/she desires to change a song or the volume. This may result in disturbance and wastage of time, as well as entail unwanted action, whereby the electronic device has to be taken out of the holster and then put back inside it.

BRIEF DESCRIPTION OF THE FIGURES

The accompanying figures, where like reference numerals refer to identical or functionally similar elements throughout the separate views, and which, together with the detailed description below, are incorporated in and form part of the specification, serve to further illustrate various embodiments and explain various principles and advantages, all in accordance with the present invention.

Figure 1:
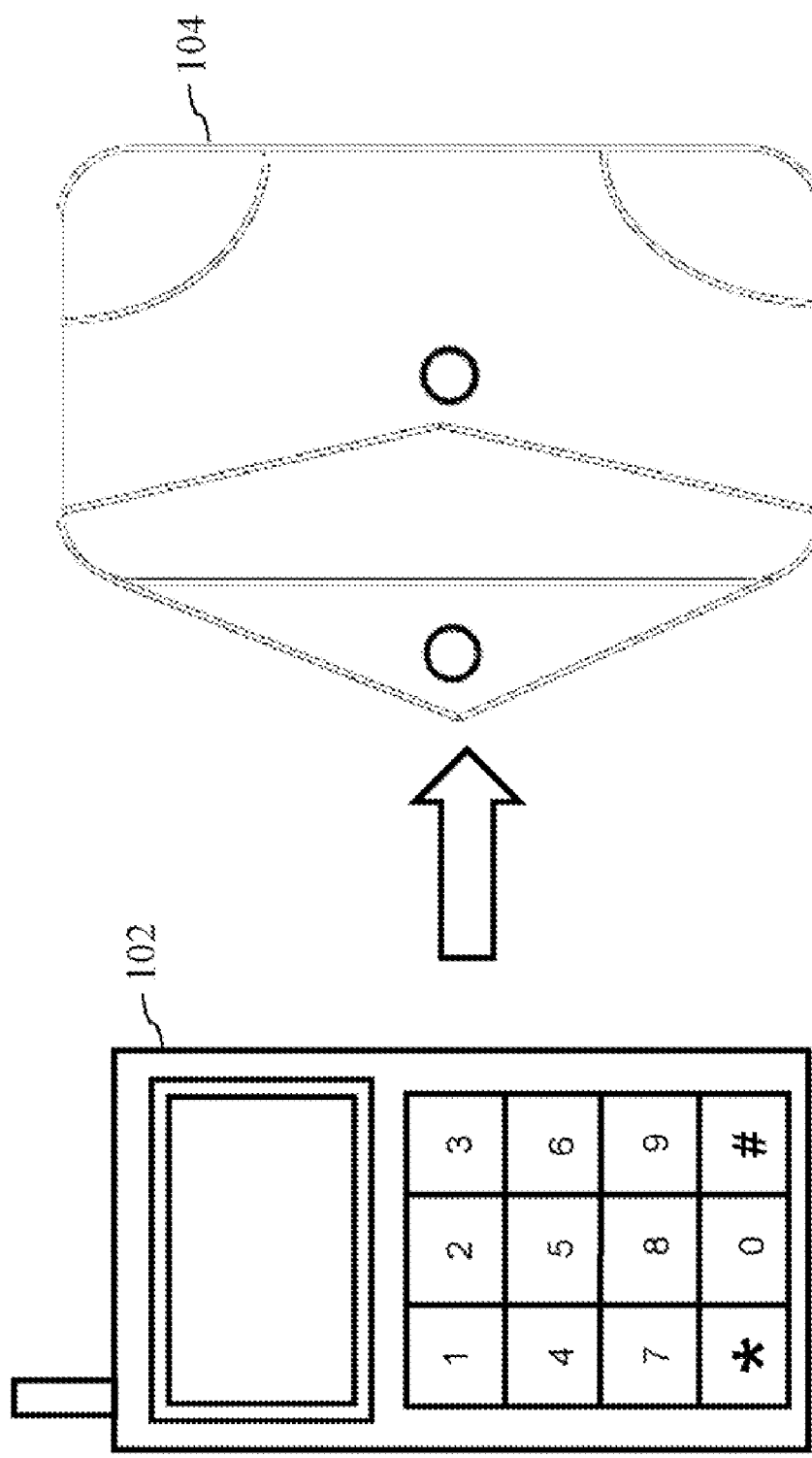
FIG. 1 illustrates a handheld electronic device and an exemplary external accessory for housing the handheld electronic device, in accordance with an embodiment of the present invention.

Skilled artisans will appreciate that elements in the figures are illustrated for simplicity and clarity and have not necessarily been drawn to scale. For example, the dimensions of some of the elements in the figures may be exaggerated, relative to other elements, to help in improving an understanding of the embodiments of the present invention.

DETAILED DESCRIPTION

Before describing in detail the particular method and system for controlling at least one function of a plurality of functions of a handheld electronic device, in accordance with various embodiments of the present invention, it should be observed that the present invention resides primarily in combinations of method steps related to controlling at least one function of a plurality of functions of a handheld electronic device. Accordingly, the apparatus components and method steps have been represented, where appropriate, by conventional symbols in the drawings, showing only those specific details that are pertinent for an understanding of the present invention, so as not to obscure the disclosure with details that will be readily apparent to those with ordinary skill in the art, having the benefit of the description herein.

In this document, the terms "comprises", "comprising", or any other variation thereof, are intended to cover a non-exclusive inclusion, such that a process, method, article or apparatus that comprises a list of elements does not include only those elements but may include other elements that are not expressly listed or inherent in such a process, method, article or apparatus. An element proceeded by "comprises . . . a" does not, without more constraints, preclude the existence of additional identical elements in the process, method, article or apparatus that comprises the element. The term "another", as used in this document, is defined as at least a second or more. The terms "includes" and/or "having", as used herein, are defined as comprising.

For one embodiment, a method for controlling at least one function of a plurality of functions of a handheld electronic device is provided. The method includes determining whether the handheld electronic device is docked in an external accessory, the external accessory being movably coupled to a swivel. Further, the method includes measuring a first magnetic field density, which corresponds to an angular position of the swivel with respect to the external accessory when the handheld electronic device is docked in the external accessory. Furthermore, the method includes generating a signal, to activate the at least one function, based on an electrical parameter. The electrical parameter is based on the measured first magnetic field density.

For another embodiment, a handheld electronic device is provided. The handheld electronic device includes a first sensor that is configured to measure a first magnetic field density. The first magnetic field density is based on the presence of a first magnet that is housed in an external accessory. Further, the handheld electronic device includes a second sensor that is configured to measure a change in a second magnetic field density. The second magnetic field density is based on the presence of a second magnet that is housed in the external accessory. Furthermore, the handheld electronic device includes a processor that generates a signal to activate at least one function of the handheld electronic device, based on the voltage. The voltage is based on the measured first magnetic field density.

For yet another embodiment, an external accessory is provided. The external accessory includes a transducer that is configured to generate a voltage. The voltage is based on the angular position of a swivel with respect to the external accessory. Further, the external accessory includes a converter that converts the generated voltage to a digital value. Furthermore, the external accessory includes a transmitter that transmits the digital value to a handheld electronic device.

FIG. 1 illustrates a handheld electronic device 102 and an exemplary external accessory 104 that house the handheld electronic device 102, in accordance with an embodiment of the present invention. Examples of the handheld electronic device 102 include, but are not limited to, a cordless phone, a mobile phone and a Personal Digital Assistant (PDA). Typically, the handheld electronic device 102 can provide a plurality of operational features or functions that facilitate control of the handheld electronic device 102. For example, if the handheld electronic device 102 is a mobile phone, these functions can be, for example, ring tone selection, ringing-volume control, sending/receiving messages, selecting the mode of operation, and the like. For one embodiment, the functions of the handheld electronic device 102 can be controlled with the help of a plurality of keys provided on the keypad of the handheld electronic device 102. For example, there can be a key for controlling the volume of the handheld electronic device 102.

To make the process of carrying the handheld electronic device 102 convenient, the handheld electronic device 102 can be docked in the external accessory 104. For one embodiment, the external accessory 104 can be, for example, a holster. Typically, a holster can be used as a belt clip to attach the handheld electronic device 102 to a user's waist belt. This also protects the handheld electronic device 102 from damage.

For one embodiment, the user of the handheld electronic device 102 would have to take the device out of the external accessory 104 before changing any operational features on it, if the handheld electronic device 102 is docked in the external accessory 104. For example, if users of mobile phones want to change the ring volume of their phones, they would have to take the phones out of the external accessory and change the ring volume. After the ring volume is changed they would have to put back their phones inside the holsters.

Figure 2:
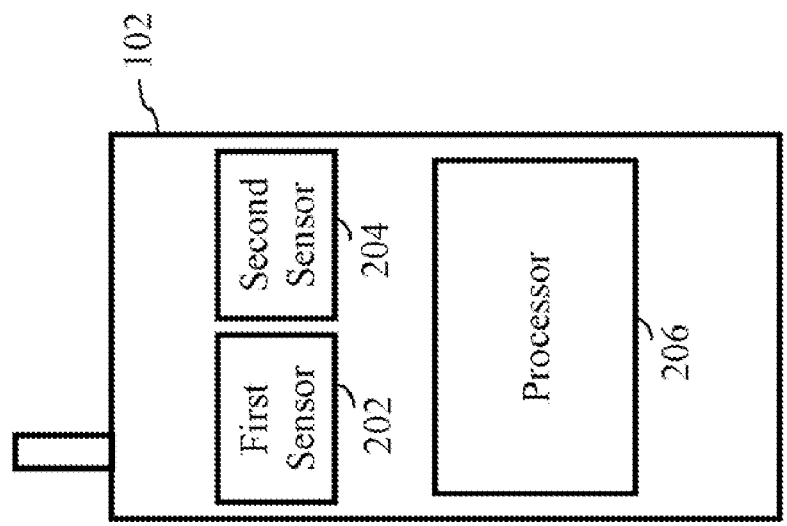
FIG. 2 illustrates a block diagram of an exemplary handheld electronic device, in accordance with an embodiment of the present invention.

FIG. 2 illustrates a block diagram of the handheld electronic device 102, in accordance with an embodiment of the present invention. Those skilled in the art will appreciate that the handheld electronic device 102 may include all or some of the components shown in FIG. 2. Further, those ordinarily skilled in the art will understand that the handheld electronic device 102 may include additional components that are not shown here and are not germane to the operation of the handheld electronic device 102, in accordance with the inventive arrangements.

The handheld electronic device 102 includes a first sensor 202, a second sensor 204 and a processor 206. The first sensor 202 is configured to measure a first magnetic field density, based on the presence of a first magnet. For an embodiment, the first sensor 202 is a Hall Effect sensor. The first magnet is housed in an external accessory, for example, a holster. For an embodiment, the external accessory is movably coupled to a swivel, which enables it to be rotated about its axis. The external accessory can also include a selective magnetic shield over the first magnet. For an embodiment, the selective magnetic shield is composed of Mu metal, which is a nickel-iron alloy with high magnetic permeability.

When the external accessory is rotated about its axis, the selective magnetic shield covers a part of the first magnet. Consequently, the first magnetic field density measured by the first sensor 202 also changes. In other words, the measured first magnetic field density is dependent on the angular position of the external accessory with respect to the swivel. Rotating the external accessory changes the angular position of the accessory with respect to the swivel, and hence, the first magnetic field density measured by the first sensor 202 changes. The movable external accessory mentioned above is explained in detail in conjunction with FIGS. 3 and 4.

The first sensor 202 can also be configured to generate a voltage that corresponds to the measured first magnetic field density. For one embodiment, this can be performed by using a Hall Effect sensor as the first sensor 202. Typically, a Hall Effect sensor is a transducer that varies its output voltage according to the changes in magnetic field density. Those ordinarily skilled in the art will appreciate that the invention can also work with any other sensor, which can generate a voltage corresponding to the measured magnetic field density.

The handheld electronic device 102 also includes the second sensor 204, which is configured to measure a change in the second magnetic field density. Like the first magnetic field density, the second magnetic field density is based on the presence of a second magnet. For an embodiment, the second sensor 204 can be a Hall Effect sensor. For an embodiment, the second magnet is housed in the external accessory. Further, the first sensor 202 is activated only when the measured change in the second magnetic field density is greater than a predefined value. In other words, the first sensor 202 does not work until the change in the second magnetic field density is greater than a predefined value. This process prevents the first sensor 202 from measuring any additional magnetic field density, which may not be caused by the presence of the first magnet.

For one embodiment, the change in the second magnetic field density can be greater than the predefined value only when the handheld electronic device 102 is docked in the external accessory. This is because the second magnet, which is housed in the external accessory, creates a magnetic field density, which is greater than the predefined value. Consequently, when the second sensor 204 comes in contact with the external accessory, it measures the magnetic field density created by the second magnet, and hence, the measured field density is greater than the predefined value. Further, the predefined value can be configured, based on the magnetic field density created by the second magnet. For example, the magnetic field density is large for a big second magnet. Consequently, the predefined value is greater than the value corresponding to a smaller magnet.

For one embodiment, the handheld electronic device 102 also includes a processor 206. The processor 206 can be configured to generate a signal to activate at least one function of the handheld electronic device 102. The generated signal can be based on a voltage, which, in turn, can be based on the measured first field density. The functioning of the processor 206 can be understood with the help of the following example. Consider a case when a user of the handheld electronic device 102 intends to change the mode of operation of his/her device, for example, from a 'general' to a 'silent' mode. The handheld electronic device 102 may be docked in an external accessory such as a holster. Consequently, the second magnetic field density, measured by the second sensor 204, will be higher than the predefined value, since the handheld electronic device 102 is docked in the holster. As a result, the first sensor 202 can be activated by the second sensor 204. On being activated, the first sensor 202 measures the first magnetic field density corresponding to the first magnet. Further, to change the mode of operation, the user can rotate the holster about the swivel. On being rotated about the swivel, the position of the first magnet attached to the holster changes, and consequently, the first magnetic field density also changes. For an embodiment, an electrical parameter such as a voltage is generated, which corresponds to the changed first magnetic field density of the first sensor 202.

The voltage generated by the first sensor 202 is thereafter utilized by the processor 206 to generate a signal, to change the mode of operation of the handheld electronic device 102. The generated signal can be a digital or an analog signal. The type of signal generated is based on the type of the processor 206 used. The mode of operation of the handheld electronic device 102 is changed after the signal is generated by the processor 206. It should be noted that the user may choose to change any other preconfigured function of the handheld electronic device 102. This is different from changing the mode of operation of the device. The change in the mode of operation has been explained above. A user may opt to change in any other function such as the ring tune or ring volume of the handheld electronic device 102.

Figure 3:
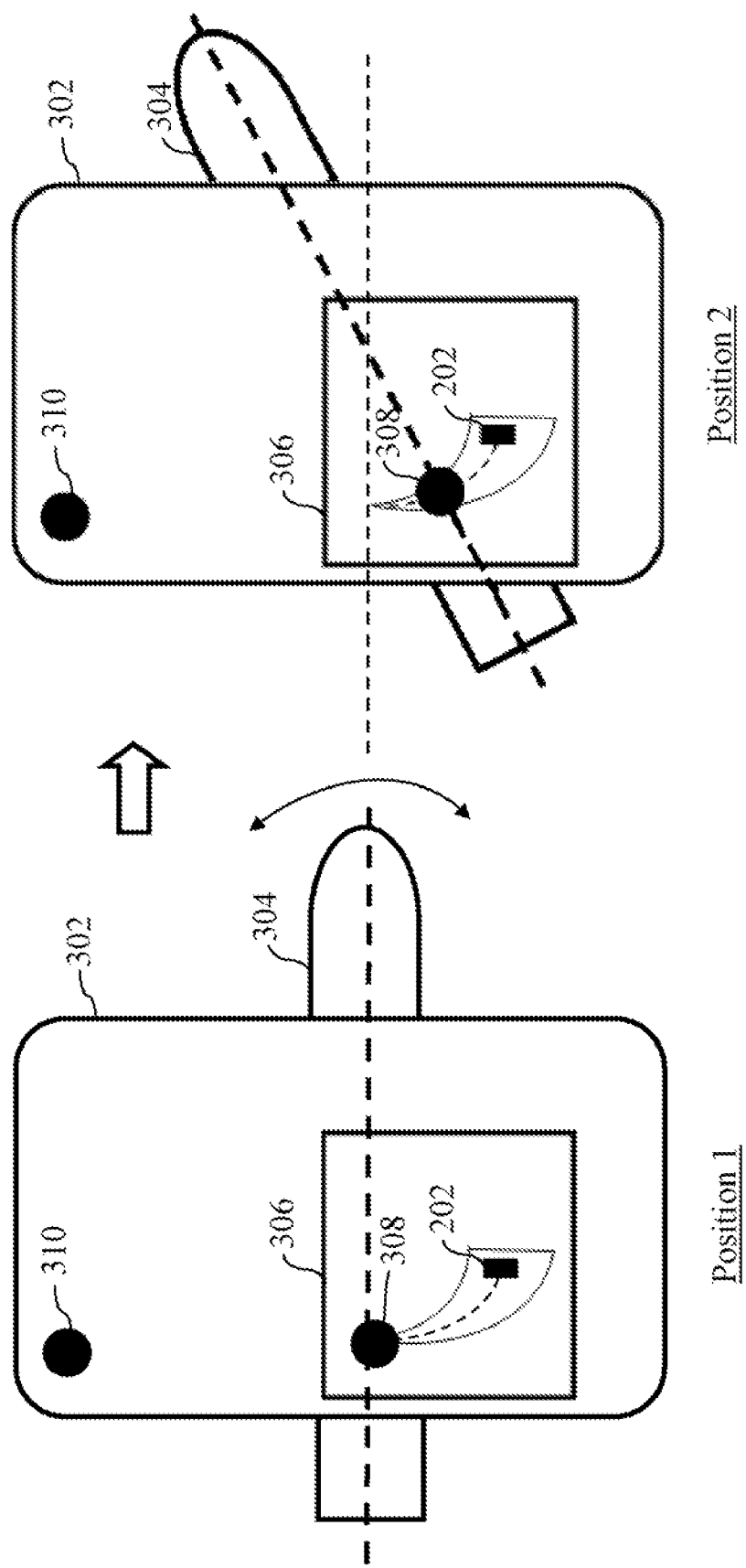
FIG. 3 illustrates a block diagram of an exemplary external accessory, in accordance with an embodiment of the present invention.

FIG. 3 illustrates a block diagram of an exemplary external accessory 302, in accordance with an embodiment of the present invention. Those skilled in the art will appreciate that the external accessory 302 may include all or some of the components shown in FIG. 3. Further, those ordinarily skilled in the art will understand that the external accessory 302 may include additional components that are not shown here and are not germane to the operation of the external accessory 302, in accordance with the inventive arrangements. To describe the external accessory 302, reference will be made to FIGS. 1 and 2, although it should be understood that the external accessory 302 can be used in any other suitable environment or network.

For one embodiment, the external accessory 302 can include a swivel 304, a selective-magnetic shield 306, a first magnet 308 and a second magnet 310. For one embodiment, the external accessory 302 can be a holster. Further, the swivel 304 can be movably coupled to the external accessory 302. This enables the external accessory 302 to be rotated around its axis. The axis of the external accessory 302 is a hypothetical line that passes through the centre of its body. For example, the axis can be a line that is perpendicular to the length of the external accessory 302 and passes through the centre of its body. In accordance with an embodiment, the rotation of the external accessory has been shown as 'position 1' and 'position 2' in FIG. 3. However, it will be apparent to a person skilled in the art that the external accessory can be rotated in other positions as well along the axis of the swivel. Further, the swivel 304 can also include a belt clip, which enables users of the external accessory 302 to attach it to their belts. Furthermore, users can rotate the external accessory 302 about the swivel 304, even when the external accessory 302 is attached to their belts.

Along with the movable swivel 304, the external accessory 302 also includes the selective magnetic shield 306. For one embodiment, the selective magnetic shield 306 can be made of Mu metal. The selective magnetic shield 306 selectively shields the first magnet 308 from any Hall Effect sensor that comes in contact with the external accessory 302. In other words, when the selective magnetic shield 306 completely covers the first magnet 308, no sensor in the vicinity of the external accessory 302 will detect any magnetic field density.

When the shield 306 is not covering the first magnet 308 completely, a sensor in the vicinity can sense the magnetic field density, depending on the shielding of the first magnet 308. For one embodiment, the selective magnetic shield 306 can have an arc-shaped cut, as shown in FIG. 3. This arc-shaped cut enables the selective magnetic shield 306 to partially shield the first magnet 308. For example, the first magnet 308 is partially shielded in 'position 2', as compared to 'position 1', where it is fully shielded. It will be apparent to a person ordinarily skilled in the art that the selective magnetic shield can be designed by using other techniques that are well known in the art. Additionally, for one embodiment, the first magnet 308 can be coupled to the swivel 304. As a result, when the external accessory 302 is rotated about its axis, the first magnet 308 moves from, for example, the fully shielded state of 'position 1' to the partially shielded state of 'position 2'. Consequently, the first sensor 202 is not able to measure a first magnetic field density when the first magnet 308 is fully shielded, as in position 1. However, the first sensor 202 will measure a certain value of the first magnetic field density when the external accessory 302 is rotated to the 'position 2'. Further, the first magnetic field density, measured by the first sensor 202, changes as the external accessory 302 is rotated about its axis.

In addition to the first magnet 308, the external accessory 302 also includes a second magnet 310. The second magnet 310, along with the second sensor 204, can be used to determine whether the handheld electronic device 102 is docked in the external accessory 302. The functioning of the second magnet 310 and the second sensor 204 has already been explained in conjunction with FIG. 2.

Figure 4:
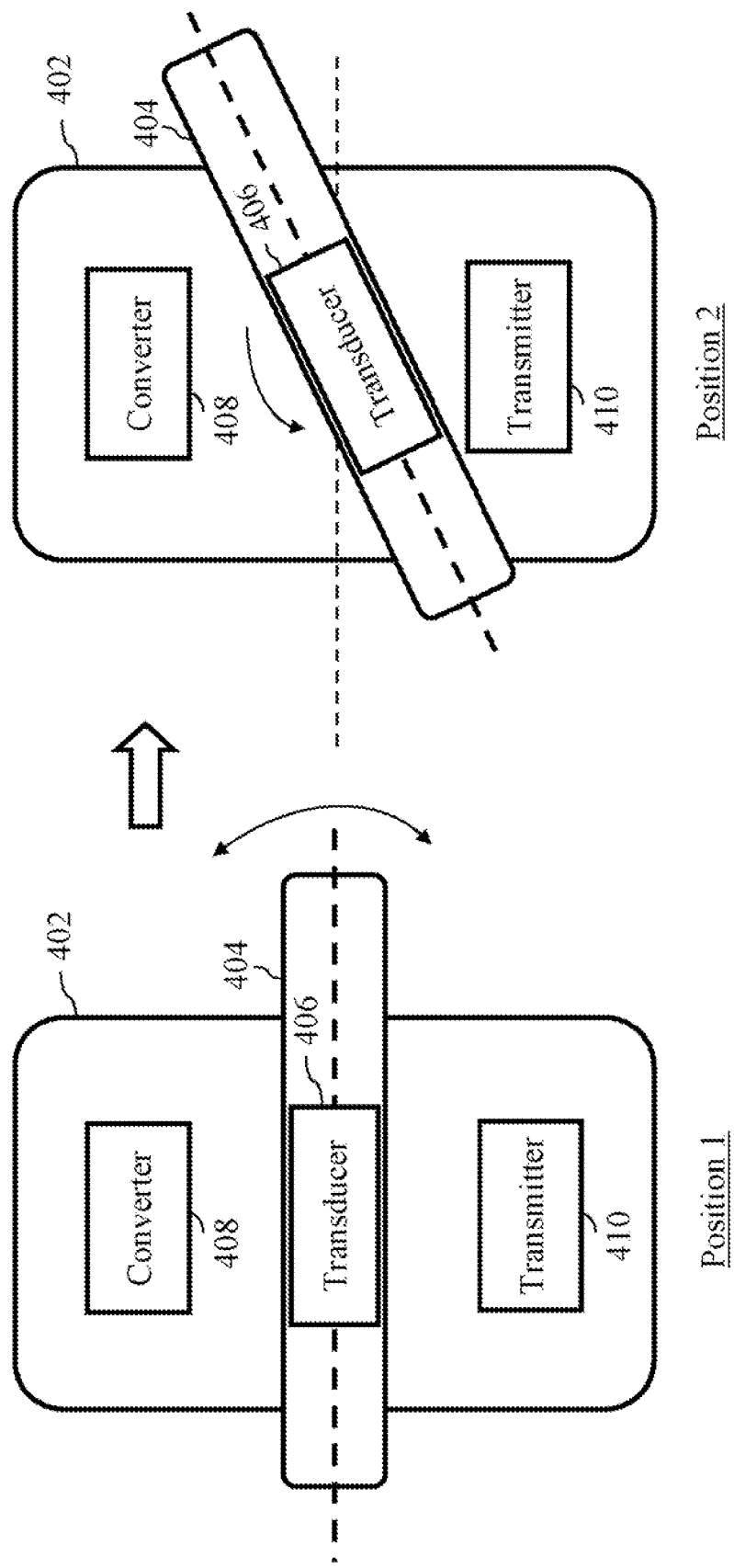
FIG. 4 illustrates a block diagram of an exemplary external accessory, in accordance with another embodiment of the present invention.

FIG. 4 illustrates a block diagram of an exemplary external accessory 402, in accordance with another embodiment of the present invention. Those skilled in the art will appreciate that the external accessory 402 may include all or some of the components shown in FIG. 4. Further, those ordinarily skilled in the art will understand that the external accessory 402 may include additional components that are not shown here and are not germane to the operation of the external accessory 402, in accordance with the inventive arrangements. To describe the external accessory 402, reference is made to FIGS. 1 and 2, although it should be understood that the external accessory 402 can be used in any other suitable environment or network.

For one embodiment, the external accessory 402 can include a swivel 404, a transducer 406, a converter 408 and a transmitter 410. The external accessory 402 can be, for example, a holster, and can be movably coupled to the swivel 404. Consequently, the external accessory 402 can be rotated about its axis, as shown in 'position 1' and 'position 2'. The swivel 404 is attached to the transducer 406. The transducer 406 is configured to measure an angular position of the swivel 404 with respect to the external accessory 402. In other words, the transducer 406 measures the angle of the external accessory 402 with respect to the swivel 404. After measuring the angle, the transducer 406 generates a voltage, based on the measured angle. For example, for 'position 1', corresponding to an angle of, for instance, 6 degrees with respect to the axis of the external accessory 402, as shown in FIG. 4, the transducer 406 may generate a voltage of 2 Volts. Similarly, the transducer 406 may generate a voltage of 5 Volts for 'position 2', as shown in FIG. 4, corresponding to an angle of, for instance, 60 degrees, with respect to the axis of the external accessory 402. For one embodiment, the transducer 406 can be an electrical potentiometer, an optical encoder or an electromechanical encoder. The generated voltage is thereafter converted by the converter 408 to a digital value. For example, 2 Volts can be converted to 0010, and 5 Volts can be converted to 0101. For one embodiment, the converter 408 is an Analog to Digital Converter (ADC). After the voltage is converted to a digital value, the digital value is transmitted by the transmitter 410 to the handheld electronic device 102. The method for measuring the angle and communicating the corresponding digital value to the electronic device 102, mentioned above, only takes place when it is determined that the handheld electronic device 102 is docked in the external accessory 402.

For one embodiment, a transmitter inside the handheld electronic device 102 can send a signal to the transmitter 410 that the electronic device 102 is docked in the external accessory 402, to confirm that the handheld electronic device 102 is docked in the external accessory 402. For another embodiment, the transmitter 410 can detect the presence of the electronic device 102 in the external accessory 402 and send a signal to the transmitter of the handheld electronic device 102, to confirm that the handheld electronic device 102 is docked in the external accessory 402. In this case, the transmitter 410 receives confirmation that the handheld electronic device 102 is docked in the external accessory 402 when the transmitter of the electronic device reciprocates with a signal of its own. Further, the transducer 406 can be activated only when the transmitter 410 receives confirmation that the handheld electronic device 102 is docked in the external device 402. For example, the transmitter 410 will not measure the angular position of the swivel 404 unless the transmitter 410 receives confirmation that the handheld electronic device 102 is docked in the external accessory 402.

After it is confirmed that the handheld electronic device 102 is docked in the external accessory 402, the angular position of the swivel 404 is measured and a digital value, corresponding to the angular position, is transmitted to the handheld electronic device 102. The handheld electronic device 102 thereafter uses the received digital value to change or modify at least one function of the electronic device 102. For example, a user of the handheld electronic device 102 can rotate the external accessory 402 when the device is docked in the external accessory 402. The change in the angular position of the swivel 404 may change the voltage output of the transducer 406 from 2 Volts to 5 Volts. A digital value, corresponding to 5 Volts, can be generated by the converter 408 and transmitted to the handheld electronic device 102. The handheld electronic device 102 can then change the mode of operation of the electronic device from, for example, 'general' to 'silent', corresponding to the received digital value. This can be understood by assuming that the digital value corresponding to 2 Volts might activate the mode of 'general' operation, and a digital value corresponding 5 Volts might activate the 'silent' mode. There may be other options, such as the 'vibration' mode of an operation for a digital value corresponding to 3 Volts. Moreover, the user may opt for a change in other functions when the external accessory 402 is rotated, like change in ring volume, change in ring tone, and the like.

In addition to the components shown in the FIG. 4, the external accessory 402 can also include a battery. The battery can be used to provide energy for the working of the transducer 406, the converter 408 and the transmitter 410. Other means of providing energy to the components may be through the handheld electronic device 102. In other words, the external accessory 402 can utilize the power supply of the handheld electronic device 102 when the electronic device is housed in the external accessory 402. In this event, no separate battery is required in the external accessory 402, to provide energy for the working of its components.

Figure 5:
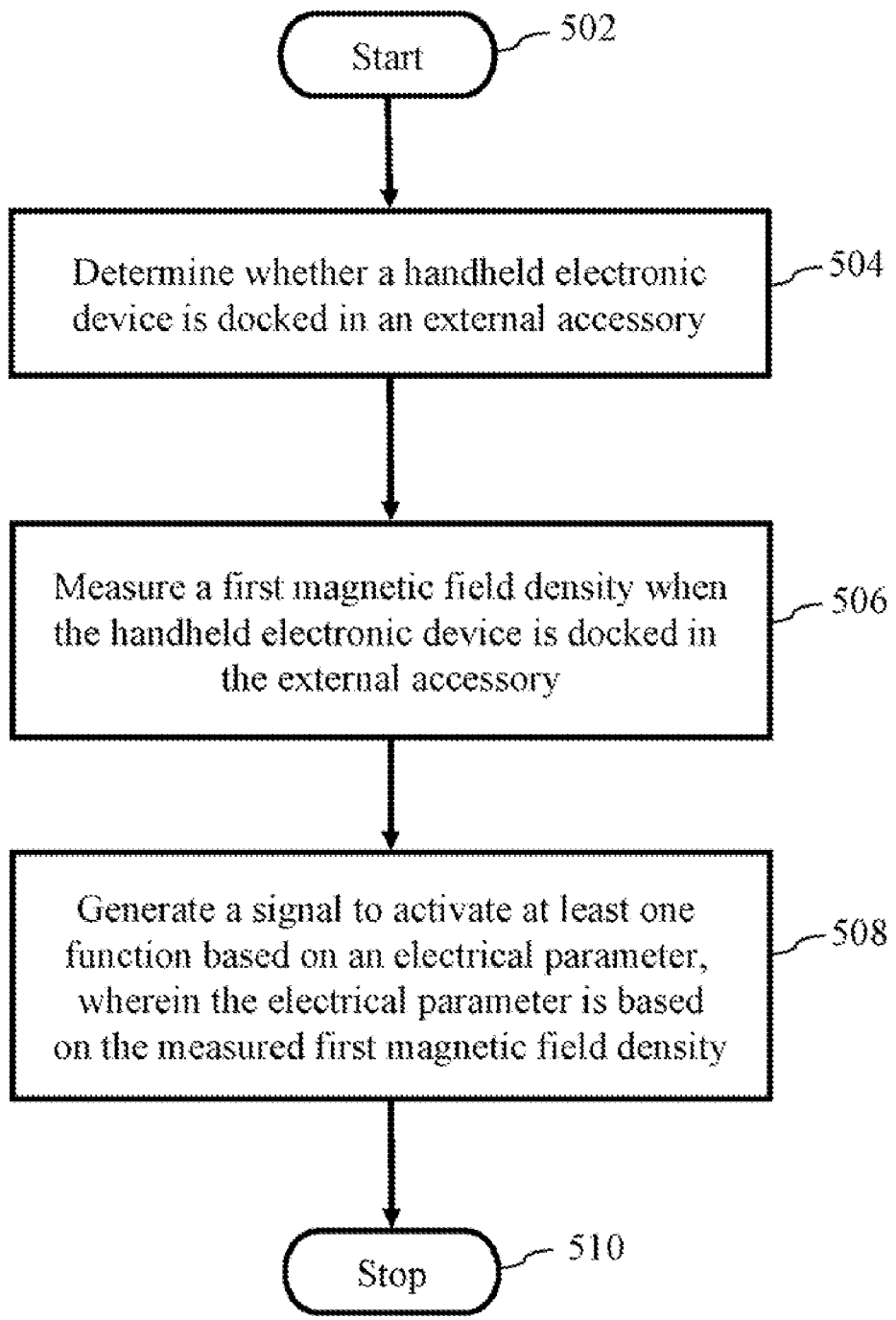
FIG. 5 illustrates a flow diagram illustrating a method for controlling at least one function of a plurality of functions of a handheld electronic, in accordance with an embodiment of the present invention.

FIG. 5 illustrates a flow diagram illustrating a method 500 for controlling at least one function of a plurality of functions of the handheld electronic device 102, in accordance with an embodiment of the present invention. To describe the method 500, reference will be made to FIGS. 1, 2 and 3, although it should be understood that the method 500 can also be implemented in any other suitable environment or network. Moreover, the invention is not limited to the order in which the steps are listed in the method 500.

At step 502, the method 500 is initiated. At step 504, it is determined whether the handheld electronic device 102 is docked in the external accessory. For an embodiment, the external accessory can be the external accessory 302. Further, the external accessory 302 can be movably coupled to the swivel 304, enabling it to be rotated about its axis. The external accessory 302, with the movably coupled swivel 304, has already been explained in conjunction with FIG. 3.

In the subsequent description, the method 500 has been explained in conjunction with the external accessory 302. However, it will be readily apparent to a person ordinarily skilled in the art that the method 500 can also be implemented by using the external accessory 402 or any other external accessory that is suitable for the purpose. For one embodiment, a change in a second magnetic field density is measured, to determine whether the handheld electronic device 102 is docked in the external accessory 302. The second magnetic field density corresponds to a magnetic field created by the second magnet 310. The second magnet 310 can be coupled to the external accessory 302. The external accessory 302, along with the coupled second magnet 310, has already been explained in conjunction with FIG. 3. The measurement of the change in the second magnetic field density is performed by the second sensor 204, which is housed in the handheld electronic device 102. When the change in second magnetic field density is greater than a predefined value, it is confirmed that the handheld electronic device 102 is docked in the external accessory 302. The predefined value can be set in such a manner that the measured change in the second magnetic field density is higher than the predefined value, only when the second sensor 204 is near the second magnet 310. In other words, the predefined value can be based on the magnetic field density created by the second magnet 310. If the second magnet is bigger in size, the corresponding predefined value can also be larger than the value of a smaller-sized magnet.

At step 506, the first magnetic field density of the handheld electronic device 102 is measured when it is docked in the external accessory 302. The first magnetic field density corresponds to the magnetic field created by the first magnet 308. For an embodiment, the first magnet 308 can be coupled to the external accessory 302. Further, the first magnetic field density corresponds to the angular position of the swivel 304 with respect to the external accessory 302. Measurement of the first magnetic field density, which corresponds to the angular position of the swivel 304, has already been explained in conjunction with FIG. 3. The first magnetic field density is measured by a first sensor 202, which is housed in the handheld electronic device 102. For an embodiment, the first sensor 202 can be a Hall Effect sensor. The first sensor 202 only starts working when the handheld electronic device 102 is docked in the external accessory 302. In other words, the first sensor 202 will measure the first magnetic field density only when the change in the measured second magnetic field density is greater than the predefined value.

At step 508, a signal is generated to activate at least one function of the handheld electronic device 102, based on an electrical parameter. This electrical parameter is based on the measured first magnetic field density. For one embodiment, the electrical parameter can be a voltage or a current. Further, the generated signal can be an analog or a digital signal. The generated signal is utilized by the handheld electronic device 102 to activate at least one function. The at least one function can be a ring tone volume, a ring tone, a mode of operation, and the like. The process of activating the at least one function can be better understood with the help of the following example.

Let us consider a case when a user wants to increase the volume of the ring tone of a mobile phone, which is housed in a holster. In accordance with the present invention, the user can do this by rotating the holster to change the angular position of the holster with respect to the swivel. When this is done, the first sensor can measure the first magnetic field density corresponding to the new angular position of the holster. Thereafter, the measured first magnetic field density is converted to a corresponding voltage, which is converted to a digital signal. This digital signal can act as an indicator to the mobile phone, to increase the volume of the ring tone. Similarly, the user can also increase or decrease the volume by rotating the holster further. Moreover, the user can preset the mobile phone to change any other function, such as the ring tone or mode of operation, when the holster is rotated. At step 510, the method 500 for controlling at least one function of the plurality of functions of the handheld electronic device 102 is terminated.

Various embodiments of the method and system for controlling at least one function of a plurality of functions of a handheld electronic device provide the following advantages. Users of handheld electronic devices do not need to take the devices out of their holsters when they want to change any functions in the devices. This is convenient for the users. Further, the present invention is convenient for users while driving, attending a meeting or playing, since it may not be convenient for them to take out the electronic devices from their holsters at that time.

It will be appreciated that the method and system for controlling at least one function of a plurality of functions of a handheld electronic device, described herein, may comprise one or more conventional processors and unique stored program instructions that control the one or more processors, to implement, in conjunction with certain non-processor circuits, some, most or all of the functions of the system described herein. The non-processor circuits may include, but are not limited to, signal drivers, clock circuits, power-source circuits and user-input devices. As such, these functions may be interpreted as steps of a method for controlling at least one function of a plurality of functions of a handheld electronic device. Alternatively, some or all the functions can be implemented by a state machine that has no stored program instructions, or in one or more application-specific integrated circuits (ASICs), in which each function, or some combinations of certain of the functions, are implemented as custom logic. Of course, a combination of the two approaches can also be used. Thus, methods and means for these functions have been described herein.

It is expected that one with ordinary skill, notwithstanding possibly significant effort and many design choices motivated by, for example, available time, current technology and economic considerations, when guided by the concepts and principles disclosed herein, will be readily capable of generating such software instructions, programs and ICs with minimal experimentation.

In the foregoing specification, the invention and its benefits and advantages have been described with reference to specific embodiments. However, one with ordinary skill in the art would appreciate that various modifications and changes can be made, without departing from the scope of the present invention, as set forth in the claims below. Accordingly, the specification and the figures are to be regarded in an illustrative rather than a restrictive sense, and all such modifications are intended to be included within the scope of the present invention. The benefits, advantages, solutions to problems, and any element(s) that may cause any benefit, advantage or solution to occur or become more pronounced are not to be construed as critical, required or essential features or elements of any or all the claims. The invention is defined solely by the appended claims, including any amendments made during the pendency of this application, and all equivalents of those claims, as issued.

What is claimed is:

1. A method for controlling a mode of operation of a handheld electronic device, the method comprising the steps of:
   determining whether the handheld electronic device is docked in a holster, wherein the holster is movably coupled to a swivel that allows the holster to be rotated about an axis of the swivel;
   measuring a first magnetic field density corresponding to an angular position of the swivel with respect to the holster when the handheld electronic device is docked in the holster; and
   generating a signal to change the mode of operation of the handheld electronic device due to the angular position of the swivel based on the measured first magnetic field density.

2. The method as recited in claim 1, wherein the mode of operation includes an audio function.

3. The method as recited in claim 1 further comprising using a first sensor to measure the first magnetic field density, wherein the first sensor is housed in the handheld electronic device, and the first magnet is housed in the holster, which includes a selective magnetic shield over the first magnet.

4. The method as recited in claim 3, wherein in the measuring step when the holster is rotated about the axis the selective magnetic shield covers a part of the first magnet to change the measured first magnetic field density.

5. The method as recited in claim 4, wherein the first magnetic density is based on the presence of a first magnet coupled to the holster.

6. The method as recited in claim 1, further comprising the step of using a second sensor for measuring a change in a second magnetic field density, and wherein determining whether the handheld electronic device is docked in the holster comprises measuring a change in a second magnetic field density that is greater than a predefined value.

7. The method as recited in claim 1, wherein the swivel of the holster includes a belt clip allowing a user to swivel the device while it is attached to a belt of the user.

8. The method as recited in claim 1, wherein the determining step includes a transmitter in the holster confirming that the handheld electronic device is docked in the holster.

9. The method as recited in claim 8, wherein the measuring step includes the transmitter transmitting an angular position about the swivel to the handheld electronic device.

10. A handheld electronic device comprising:
    a first sensor configured to measure a first magnetic field density, wherein the first magnetic field density is based on a presence of a first magnet housed in a holster, the first magnetic field density corresponding to an angular position of a swivel movably coupled to the holster when the handheld electronic device is docked in the holster;

a second sensor configured to measure a change in a second magnetic field density, wherein the second magnetic field density is based on a presence of a second magnet housed in the holster, wherein the second sensor determines whether the handheld electronic device is docked in the holster; and a processor for generating a signal to change the mode of operation of the handheld electronic device due to the angular position of the swivel based on the measured first magnetic field density.

11. The handheld electronic device as recited in claim 10, wherein the mode of operation includes an audio function.

12. The handheld electronic device as recited in claim 10, wherein the first sensor is activated when the change in the second magnetic field density is greater than a predefined value.

13. The handheld electronic device as recited in claim 12, wherein the change in the second magnetic field density measured in the second sensor is greater than the predefined value when the handheld electronic device is docked in the holster.

14. The handheld electronic device as recited in claim 10, wherein the swivel of the holster includes a belt clip allowing a user to swivel the device while it is attached to a belt of the user.

15. The handheld electronic device as recited in claim 10, wherein the first magnetic field density measured at the first sensor changes when the swivel is rotated.

16. The handheld electronic device as recited in claim 10, wherein the holster includes a selective-magnetic shield over the first magnet.

17. The handheld electronic device as recited in claim 10, wherein the holster comprises:

a transducer configured to generate a voltage, wherein the voltage is based on an angular position of the swivel with respect to the holster;

a converter for converting the generated voltage to a digital value; and a transmitter for transmitting the digital value to the handheld electronic device.

18. The holster as recited in claim 17, wherein the voltage changes when the angular position of the swivel with respect to the holster is changed.

19. The holster as recited in claim 17, wherein the transducer is activated when the handheld electronic device is docked in the holster.

20. The holster as recited in claim 19, wherein the transducer is selected from a group comprising a potentiometer, a Zigbee device, a Radio Frequency (RF) device and an optical transducer.

* * * * *

UNITED STATES PATENT AND TRADEMARK OFFICE
CERTIFICATE OF CORRECTION

PATENT NO. : 7,523,012 B2
APPLICATION NO. : 11/772948
DATED : April 21, 2009
INVENTOR(S) : Shah et al.

It is certified that error appears in the above-identified patent and that said Letters Patent is hereby corrected as shown below:

IN THE CLAIMS:

1. In Column 10, Line 35, in Claim 3, delete "density," and insert -- density of a first magnet, --, therefor.

Signed and Sealed this

Twenty-first Day of September, 2010

David J. Kappos
*Director of the United States Patent and Trademark Office*